(12) United States Patent
Khlat et al.

(10) Patent No.: US 8,705,654 B1
(45) Date of Patent: Apr. 22, 2014

(54) MEASURING PHASE SHIFT IN A RADIO FREQUENCY POWER AMPLIFIER

(75) Inventors: Nadim Khlat, Cugnaux (FR); Marcus Granger-Jones, Scotts Valley, CA (US); Alexander Wayne Hietala, Phoenix, AZ (US); David Cassetti, Tempe, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 718 days.

(21) Appl. No.: 12/901,109

(22) Filed: Oct. 8, 2010

Related U.S. Application Data

(60) Provisional application No. 61/249,763, filed on Oct. 8, 2009.

(51) Int. Cl.
  *H04K 1/02* (2006.01)
  *H04L 25/03* (2006.01)
  *H04L 25/49* (2006.01)

(52) U.S. Cl.
  USPC .................... 375/297; 375/295; 375/296

(58) Field of Classification Search
  None
  See application file for complete search history.

(56) References Cited

U.S. PATENT DOCUMENTS

| | | | | |
|---|---|---|---|---|
| 5,969,551 | A * | 10/1999 | Fujioka | 327/149 |
| 6,304,140 | B1 * | 10/2001 | Thron et al. | 330/149 |
| 7,330,073 | B2 * | 2/2008 | Persson et al. | 330/149 |
| 2006/0197567 | A1 * | 9/2006 | Jakobs et al. | 327/158 |

* cited by examiner

*Primary Examiner* — Shuwang Liu
*Assistant Examiner* — Gina McKie
(74) *Attorney, Agent, or Firm* — Withrow & Terranova, P.L.L.C.

(57) ABSTRACT

The present disclosure relates to RF circuitry having delay locked loop (DLL) circuitry that may be used to measure amplitude modulation-to-phase modulation (AMPM) distortion of an RF power amplifier during factory calibration or during real time operation of the RF circuitry. During a calibration mode, the DLL circuitry may be calibrated using a reference clock signal. During a phase measurement mode, the DLL circuitry may use the reference clock signal, which is representative of an RF input signal to the RF power amplifier, and a feedback signal, which is representative of an RF output signal from the RF power amplifier, to measure a phase difference between the RF input signal and the RF output signal. By measuring the phase difference at different amplitudes of the RF output signal, the AMPM distortion of the RF power amplifier may be determined and used to correct for the AMPM distortion.

26 Claims, 5 Drawing Sheets

MEASURING PHASE SHIFT IN A RADIO FREQUENCY POWER AMPLIFIER

This application claims the benefit of provisional patent application Ser. No. 61/249,763, filed Oct. 8, 2009, the disclosure of which is hereby incorporated herein by reference in its entirety.

FIELD OF THE DISCLOSURE

Embodiments of the present disclosure relate to phase shift measurements of radio frequency (RF) power amplifiers, which may be used in RF communications systems.

BACKGROUND OF THE DISCLOSURE

With the proliferation of mobile terminals, such as smart cell phones, RF transmitter design has progressed rapidly as designers try to minimize components and reduce size, battery consumption, and the like. Likewise, modulation schemes are continuously updated to reflect new approaches to maximize information transfers in limited bandwidths. Changes in standards or standards based on newly available spectra may also cause designers to approach modulating transmitters with different techniques.

If a polar modulation scheme is used, a phase modulated signal at the desired radio frequency is provided to the input of the power amplifier and an amplitude modulation component is used to vary the supply voltage provided to the power amplifier. As a result, the power amplifier may operate in saturation and efficiency is greatly improved. Unfortunately, the amplitude modulation component that controls the supply voltage provided to the power amplifier causes unwanted phase components to be created in the output of the power amplifier due to the non-linearities of the power amplifier. This is sometimes called Amplitude Modulation-to-Phase Modulation (AMPM) distortion, and it degrades the spectral purity of the system and an Error Vector Magnitude (EVM).

In order to compensate for the AMPM distortion, polar modulation systems may pre-distort the phase modulation component provided to the power amplifier such that the AMPM distortion at the output of the power amplifier is substantially reduced. As an example, see commonly owned and assigned U.S. Patent Application Publication No. 2003/0215025, entitled AM TO PM CORRECTION SYSTEM FOR POLAR MODULATOR, filed May 16, 2002, which is hereby incorporated by reference in its entirety. One issue with the AMPM pre-distortion, or compensation, is that the AMPM distortion may change with temperature, age, or other factors during real time operation. As such, circuitry providing the AMPM pre-distortion should be re-calibrated as needed when factors affecting AMPM distortion change. Therefore, there is a need to measure AMPM distortion during real time operation and use the measured AMPM distortion to correct for the AMPM distortion.

SUMMARY OF THE EMBODIMENTS

The present disclosure relates to RF circuitry having delay locked loop (DLL) circuitry that may be used to measure amplitude modulation-to-phase modulation (AMPM) distortion of an RF power amplifier during factory calibration or during real time operation of the RF circuitry, which may be included in a communications terminal such as a cell phone. During a calibration mode, the DLL circuitry may be calibrated using a reference clock signal. During a phase measurement mode, the DLL circuitry may use the reference clock signal, which is representative of an RF input signal to the RF power amplifier, and a feedback signal, which is representative of an RF output signal from the RF power amplifier, to measure a phase difference between the RF input signal and the RF output signal. By measuring the phase difference at different amplitudes of the RF output signal, the AMPM distortion of the RF power amplifier may be determined and used to correct for the AMPM distortion during a normal operation mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to RF circuitry having delay locked loop (DLL) circuitry that may be used to measure amplitude modulation-to-phase modulation (AMPM) distortion of an RF power amplifier during factory calibration or during real time operation of the RF circuitry, which may be included in a communications terminal such as a cell phone. During a calibration mode, the DLL circuitry may be calibrated using a reference clock signal. During a phase measurement mode, the DLL circuitry may use the reference clock signal, which is representative of an RF input signal to the RF power amplifier, and a feedback signal, which is representative of an RF output signal from the RF power amplifier, to measure a phase difference between the RF input signal and the RF output signal. By measuring the phase difference at different amplitudes of the RF output signal, the AMPM distortion of the RF power amplifier may be determined and used to correct for the AMPM distortion during a normal operation mode.

Figure 1:
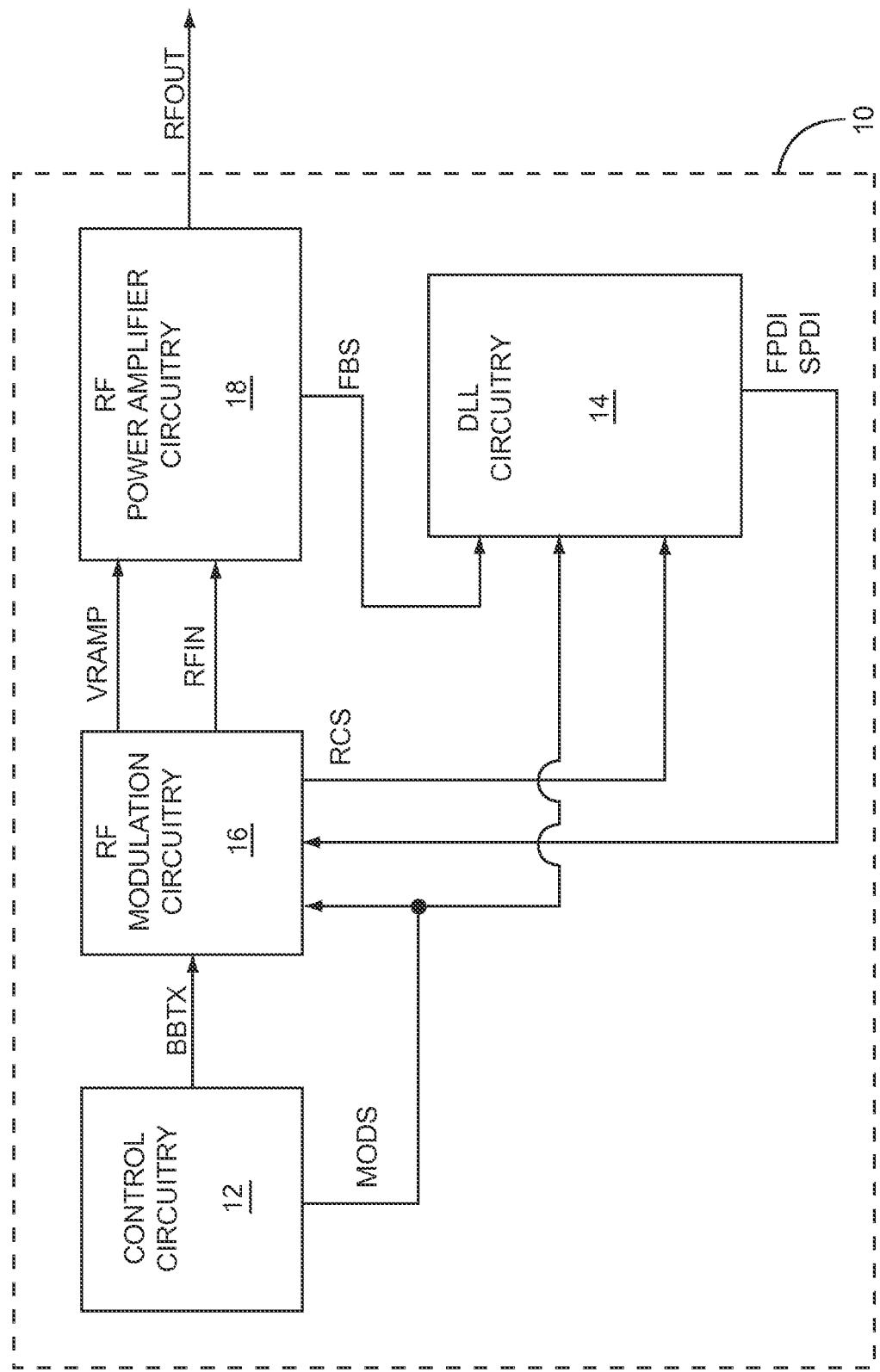
FIG. 1 shows RF communications circuitry according to one embodiment of the RF communications circuitry.

FIG. 1 shows RF communications circuitry 10 according to one embodiment of the RF communications circuitry 10. The RF communications circuitry 10 includes control circuitry 12, DLL circuitry 14, RF modulation circuitry 16, and RF power amplifier circuitry 18. The control circuitry 12 provides a baseband transmit signal BBTX to the RF modulation circuitry 16 and provides a mode select signal MODS to the RF modulation circuitry 16 and to the DLL circuitry 14. The RF modulation circuitry 16 provides a reference clock signal RCS to the DLL circuitry 14. Further, the RF modulation circuitry 16 provides an RF input signal RFIN and an envelope power control signal VRAMP to the RF power amplifier circuitry 18, which provides a feedback signal FBS to the DLL circuitry 14 and provides an RF output signal RFOUT. The DLL circuitry 14 provides first phase difference information FPDI and second phase difference information SPDI to the RF modulation circuitry 16.

Figure 2:
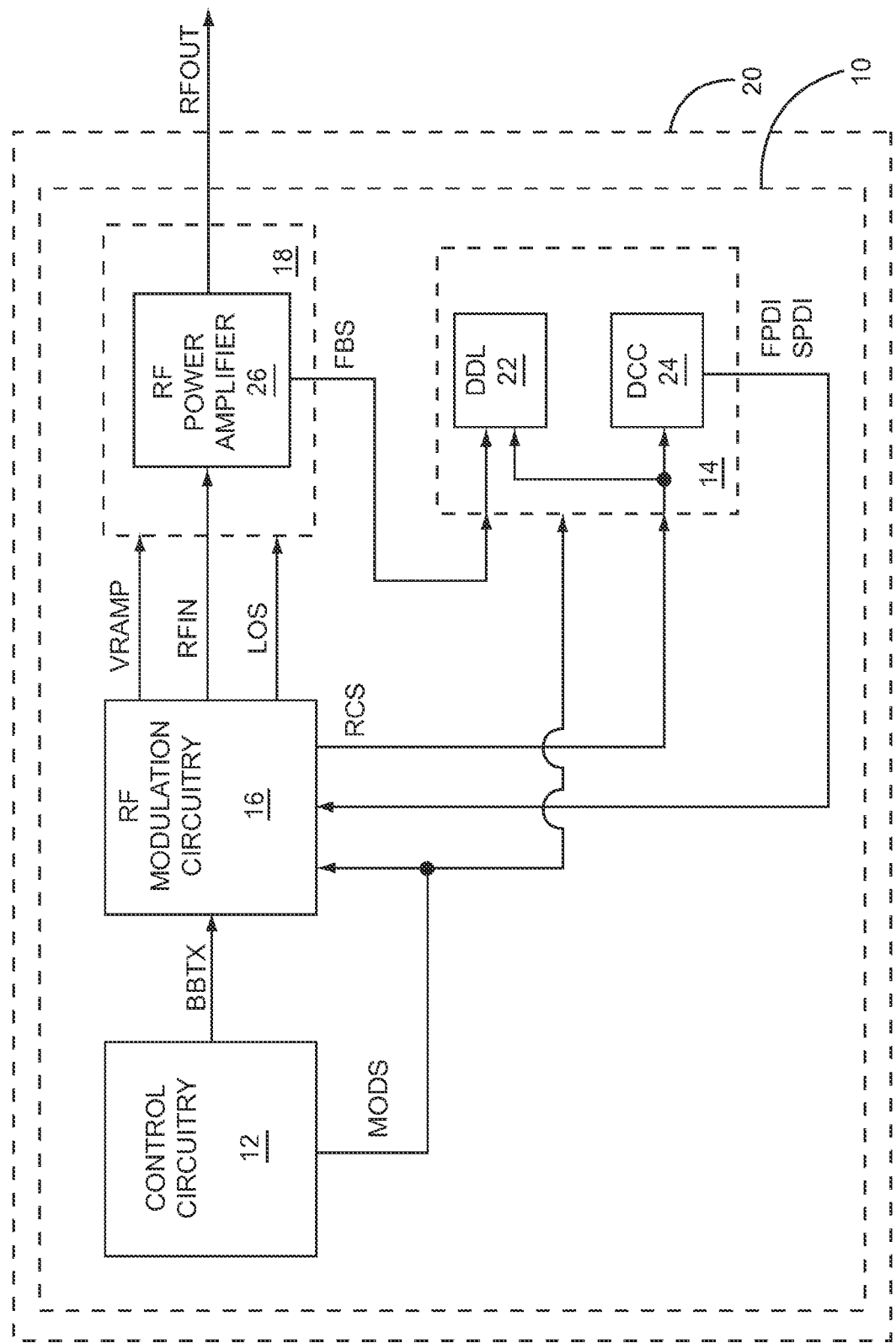
FIG. 2 shows the RF communications circuitry according to an alternate embodiment of the RF communications circuitry.

FIG. 2 shows the RF communications circuitry 10 according to an alternate embodiment of the RF communications circuitry 10. The RF communications circuitry 10 illustrated in FIG. 2 is similar to the RF communications circuitry 10 illustrated in FIG. 1, except in the RF communications circuitry 10 illustrated in FIG. 2, a transceiver integrated circuit (IC) 20 provides the RF communications circuitry 10, details of the DLL circuitry 14 and the RF power amplifier circuitry 18 are shown, and the RF modulation circuitry 16 provides a local oscillator signal LOS to the RF power amplifier circuitry 18. In other embodiments of the RF communications circuitry 10, the RF modulation circuitry 16, the RF power amplifier circuitry 18, or both may be provided by circuitry other than the RF communications circuitry 10.

The DLL circuitry 14 includes a digital delay line 22 and data capture circuitry 24, and the RF power amplifier circuitry 18 includes an RF power amplifier 26. The control circuitry 12 selects one of a calibration mode, a phase measurement mode, and a normal operation mode, and indicates which mode is selected via the mode select signal MODS. The digital delay line 22 receives the feedback signal FBS and the reference clock signal RCS, and provides output status information OSI to the data capture circuitry 24. The data capture circuitry 24 further receives the reference clock signal RCS and provides the first phase difference information FPDI and the second phase difference information SPDI.

During the normal operation mode, the RF communications circuitry 10 may transmit data via RF transmit signals using the RF output signal RFOUT. As such, during the normal operation mode, the control circuitry 12 may provide data via the baseband transmit signal BBTX to the RF modulation circuitry 16, which up-converts the baseband transmit signal BBTX to provide the RF input signal RFIN. Further, during the normal operation mode, the RF power amplifier 26 receives and amplifies the RF input signal RFIN to provide the RF output signal RFOUT. The RF output signal RFOUT may be phase modulated, amplitude modulated, or both. Additionally, an amplitude of the RF output signal RFOUT may be controlled based on the envelope power control signal VRAMP, which may be amplitude modulated for envelope tracking or saturated operation of the RF power amplifier 26, or may provide an amplitude ramp for the RF output signal RFOUT. As such, the RF power amplifier circuitry 18 may include power control circuitry, such as a DC-DC converter (not shown), which receives the envelope power control signal VRAMP and provides power for amplification to the RF power amplifier 26 based on the envelope power control signal VRAMP.

During the normal operation mode, the RF power amplifier 26 may have AMPM distortion, which may be corrected by the RF modulation circuitry 16. As such, the RF modulation circuitry 16 may include AMPM pre-distortion circuitry (not shown), or some other means of correcting the AMPM distortion of the RF power amplifier 26. However, during operation the AMPM distortion may change due to changes in related factors, such as temperature, aging, or the like. As a result, the AMPM distortion of the RF power amplifier 26 may need to be determined to update whatever AMPM distortion correction mechanisms are being used.

The DLL circuitry 14 may be used to characterize the AMPM distortion of the RF power amplifier 26 by measuring phase differences between the RF input signal RFIN and the RF output signal RFOUT at different amplitudes of the RF output signal RFOUT. However, to accurately measure the phase differences, the digital delay line 22 must be calibrated. The DLL circuitry 14 operates in either the calibration mode or the phase measurement mode. During the calibration mode, the digital delay line 22 is calibrated, such that accurate phase difference measurements can be made, and during the phase measurement mode, the DLL circuitry 14 makes the phase difference measurements. The digital delay line 22 includes multiple digital delay elements coupled in series.

During the calibration mode, the digital delay line 22 receives and forwards the reference clock signal RCS through the digital delay elements, such that a delay of each of at least some of the digital delay elements is adjusted to make a phase difference between an output from one of the digital delay elements and an output from another of the digital delay elements equal to about zero. During the phase measurement mode, the digital delay line 22 receives and forwards the feedback signal FBS through the digital delay elements, such that the feedback signal FBS is representative of the RF output signal RFOUT at a first amplitude. Also, during the phase measurement mode, the data capture circuitry 24 captures output status via the output status information OSI from each of the at least some of the digital delay elements in response to a first transition of the reference clock signal RCS, which is representative of the RF input signal RFIN. Further, during the phase measurement mode, the data capture circuitry 24 provides the first phase difference information FPDI based on the captured output status from the digital delay elements. As such, the first phase difference information FPDI is indicative of a phase difference between the RF input signal RFIN and the RF output signal RFOUT.

During the calibration mode, the DLL circuitry 14 operates in a closed loop mode and during the phase measurement mode, the DLL circuitry 14 operates in an open loop mode. The captured output status from the digital delay elements is indicative of a phase difference between the reference clock signal RCS and the feedback signal FBS. During the phase measurement mode, the RF power amplifier 26 receives and amplifies the RF input signal RFIN to provide the RF output signal RFOUT. In one embodiment of the RF communications circuitry 10, during both the normal operation mode and the phase measurement mode, the RF input signal RFIN and the RF output signal RFOUT are phase modulated. In an alternate embodiment of the RF communications circuitry 10, during the normal operation mode, the RF input signal RFIN and the RF output signal RFOUT are phase modulated; however, during the phase measurement mode, the RF input signal RFIN and the RF output signal RFOUT are not phase modulated.

In another embodiment of the RF communications circuitry 10, during the phase measurement mode, the digital delay line 22 receives and forwards the feedback signal FBS through the digital delay elements, such that the feedback signal FBS is representative of the RF output signal RFOUT at a second amplitude, which is not equal to the first amplitude. Also, during the phase measurement mode, the data capture circuitry 24 captures output status via the output status information OSI from each of the at least some of the digital delay elements in response to a second transition of the reference clock signal RCS, which is representative of the RF input signal RFIN. Further, during the phase measurement mode, the data capture circuitry 24 provides the second phase difference information SPDI based on the captured output status from the digital delay elements. As such, the second phase difference information SPDI is indicative of a phase difference between the RF input signal RFIN and the RF output signal RFOUT. The first phase difference information FPDI and the second phase difference information SPDI may be used to determine AMPM distortion of the RF power amplifier 26. The first transition of the reference clock signal RCS and the second transition of the reference clock signal RCS may occur during an amplitude ramp of the RF output signal RFOUT. The amplitude ramp may be based on the envelope power control signal VRAMP. Other embodiments of the RF communications circuitry 10 may use any number of transitions of the reference clock signal RCS at any number of amplitudes of the RF output signal RFOUT to determine the AMPM distortion of the RF power amplifier 26.

Figure 3:
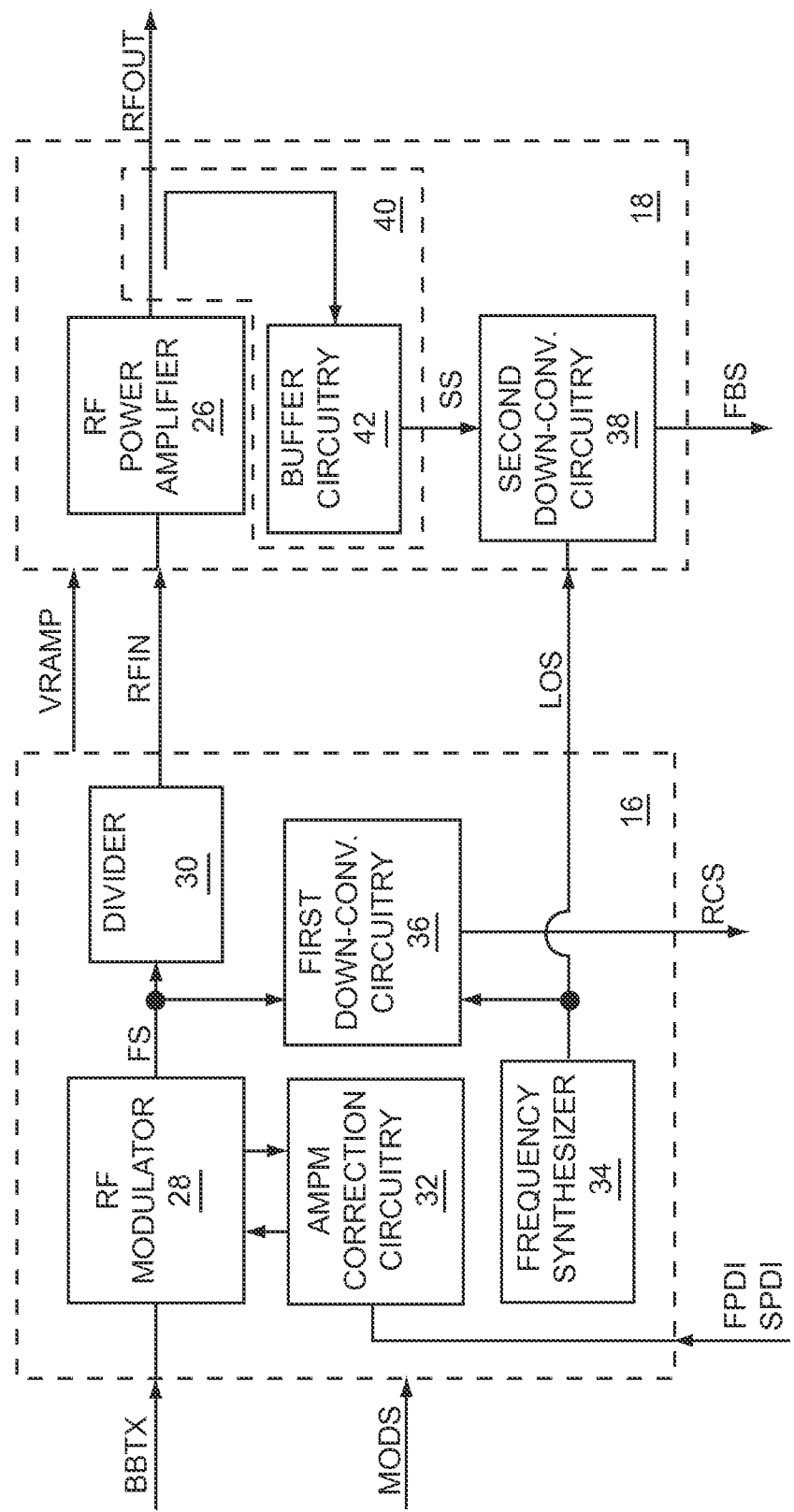
FIG. 3 shows details of RF modulation circuitry and RF power amplifier circuitry illustrated in FIG. 2 according to one embodiment of the RF modulation circuitry and the RF power amplifier circuitry.

FIG. 3 shows details of the RF modulation circuitry 16 and the RF power amplifier circuitry 18 illustrated in FIG. 2 according to one embodiment of the RF modulation circuitry 16 and the RF power amplifier circuitry 18. The RF modulation circuitry 16 includes an RF modulator 28, a divider 30, AMPM correction circuitry 32, a frequency synthesizer 34, and first down-conversion circuitry 36. The RF modulation circuitry 16 receives the mode select signal MODS and provides the envelope power control signal VRAMP to the RF power amplifier circuitry 18. Alternate embodiments of the RF modulation circuitry 16 may omit the envelope power control signal VRAMP. The RF modulator 28 receives the baseband transmit signal BBTX and, during the normal operation mode, up-converts the baseband transmit signal BBTX to provide a first signal FS. During the normal operation mode and the phase measurement mode, the divider 30 receives and divides the first signal FS to provide the RF input signal RFIN. As such, the first signal FS is representative of the RF input signal RFIN. Alternate embodiments of the RF modulation circuitry 16 may omit the divider 30. The RF modulator 28 may include phase modulation circuitry (not shown), amplitude modulation circuitry (not shown), or both, to provide the first signal FS, such that during the normal operation mode, the first signal FS may be phase modulated, amplitude modulated, or both, and during the phase measurement mode, the first signal FS may be phase modulated, amplitude modulated, or both.

During the phase measurement mode, the frequency synthesizer 34 provides the local oscillator signal LOS to the first down-conversion circuitry 36 and to second down-conversion circuitry 38. During the phase measurement mode, the first down-conversion circuitry 36 may receive and down-convert the first signal FS to provide the reference clock signal RCS using the local oscillator signal LOS. Therefore, the reference clock signal RCS may be an intermediate frequency (IF) signal. The AMPM correction circuitry 32 is coupled to the RF modulator 28 and receives the first phase difference information FPDI and the second phase difference information SPDI. As such, during the phase measurement mode, the AMPM correction circuitry 32 may determine AMPM distortion using the first phase difference information FPDI and the second phase difference information SPDI, and during the normal operation mode, the AMPM correction circuitry 32 may correct for AMPM distortion of the RF power amplifier 26 using the determined AMPM distortion. As such, the AMPM correction circuitry 32 may include AMPM pre-distortion circuitry (not shown).

The RF power amplifier circuitry 18 includes the RF power amplifier 26, the second down-conversion circuitry 38, and an RF coupler 40, which includes buffer circuitry 42. As previously mentioned, during the normal operation mode and the phase measurement mode, the RF power amplifier 26 receives and amplifies the RF input signal RFIN to provide the RF output signal RFOUT. The RF coupler 40 is coupled to an output from the RF power amplifier 26 and provides a second signal SS to the second down-conversion circuitry 38 during the phase measurement mode via the buffer circuitry 42, such that the second signal SS is representative of the RF output signal RFOUT. The second down-conversion circuitry 38 may receive and down-convert the second signal SS to provide the feedback signal FBS using the local oscillator signal LOS. Therefore, the feedback signal FBS may be an IF signal.

Since the reference clock signal RCS is used during the calibration mode to calibrate the digital delay line 22 and is used during the phase measurement mode to clock-in data from the digital delay line 22, a frequency of the reference clock signal RCS during the calibration mode must be deterministic relative to the frequency of the reference clock signal RCS during the phase measurement mode. In an exemplary embodiment of the reference clock signal RCS, the frequency of the reference clock signal RCS during the calibration mode is about equal to the frequency of the reference clock signal RCS during the phase measurement mode.

Figure 4:
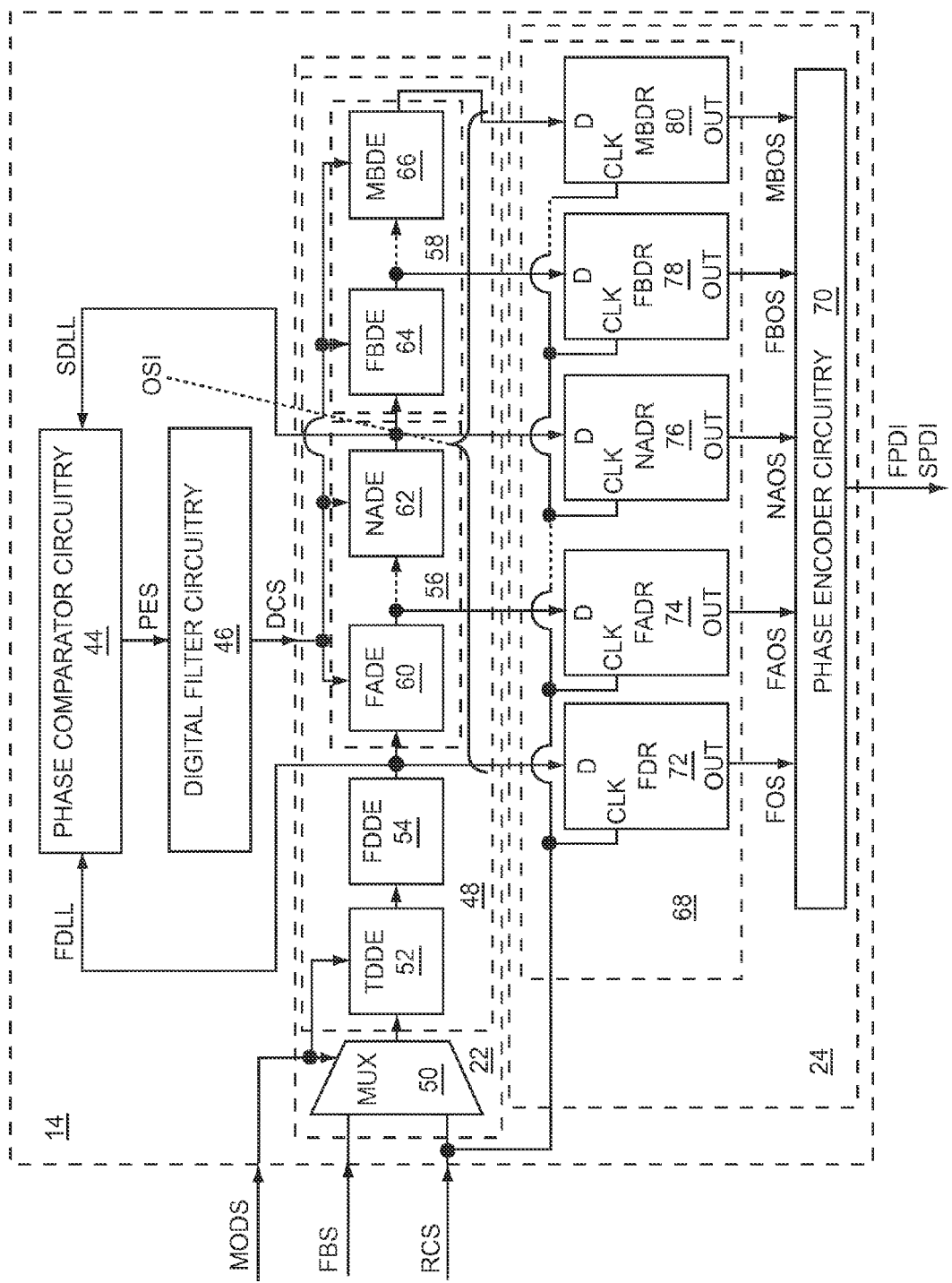
FIG. 4 shows details of delay locked loop (DLL) circuitry illustrated in FIG. 2 according to one embodiment of the DLL circuitry.

FIG. 4 shows details of the DLL circuitry 14 illustrated in FIG. 2 according to one embodiment of the DLL circuitry 14. The DLL circuitry 14 includes the digital delay line 22 and the data capture circuitry 24, and further includes phase comparator circuitry 44 and digital filter circuitry 46. The digital delay line 22 includes a multiplexer 50, a toggling digital delay element 52, a first digital delay element 54, an alpha group 56 of digital delay elements, and a beta group 58 of digital delay elements. The alpha group 56 of digital delay elements includes a first alpha digital delay element 60 and up to and including $N^{TH}$ alpha digital delay element 62 coupled in series. The beta group 58 of digital delay elements includes a first beta digital delay element 64 and up to and including an $M^{TH}$ beta digital delay element 66 coupled in series. An output from the multiplexer 50, the toggling digital delay element 52, the first digital delay element 54, the alpha group 56 of digital delay elements, and the beta group 58 of digital delay elements are coupled in series to form a digital delay line, such that the toggling digital delay element 52 is downstream from the multiplexer 50, the first digital delay element 54 is down stream from the toggling digital delay element 52, the first alpha digital delay element 60 is downstream from the first digital delay element 54, the $N^{TH}$ alpha digital delay element 62 is downstream from the first alpha digital delay element 60, the first beta digital delay element 64 is downstream from the $N^{TH}$ alpha digital delay element 62, and the $M^{TH}$ beta digital delay element 66 is downstream from the first beta digital delay element 64. In alternate embodiments of the digital delay line 22, the toggling digital delay element 52 may be omitted, the first digital delay element 54 may be omitted, any or all of the beta group 58 of digital delay elements may be omitted, or any combination thereof. N may be any whole number and M may be any whole number. In an exemplary embodiment of the digital delay line 22, N is equal to about 256 and M is equal to about 40.

The multiplexer 50 receives the feedback signal FBS and the reference clock signal RCS as multiplexer input signals and receives the mode select signal MODS as a control signal to select whether the feedback signal FBS or the reference clock signal RCS is to be forwarded to the first group 48 of digital delay elements. As such, during the calibration mode, the reference clock signal RCS is forwarded to the first group 48 of digital delay elements and during the phase measurement mode, the feedback signal FBS is forwarded to the first group 48 of digital delay elements.

An output from the first digital delay element 54 provides a first DLL signal FDLL to the phase comparator circuitry 44 and an output from the $N^{TH}$ alpha digital delay element 62 provides a second DLL signal SDLL to the phase comparator circuitry 44. During the calibration mode, the phase comparator circuitry 44 provides a phase error signal PES to the digital filter circuitry 46 based on a phase difference between the first DLL signal FDLL and the second DLL signal SDLL. During the calibration mode, the digital filter circuitry 46 receives and filters the phase error signal PES to provide a delay control signal DCS to the alpha digital delay elements 60, 62 and to the beta digital delay elements 64, 66. The delay control signal DCS controls delay through the alpha digital delay elements 60, 62 and to the beta digital delay elements 64, 66. As such, during the calibration mode, the phase comparator circuitry 44, the digital filter circuitry 46, and the alpha digital delay elements 60, 62 form a DLL, which is a closed loop, such that the delay through the alpha digital delay elements 60, 62 is adjusted until the phase difference between the output from the first digital delay element 54 and the output from the $N^{TH}$ alpha digital delay element 62 is equal to about zero, which occurs when the total delay through the alpha digital delay elements 60, 62 is about equal to one period or multiple periods of the reference clock signal RCS. In an exemplary embodiment of the alpha group 56 of digital delay elements, the total delay through the alpha digital delay elements 60, 62 is about equal to one period of the reference clock signal RCS. As previously mentioned, during the calibration mode, the DLL circuitry 14 operates in the closed loop mode, which is associated with the closed loop of the DLL.

When the DLL circuitry 14 transitions away from the calibration mode, the DLL circuitry 14 may operate in the open loop mode, in which the DLL is opened. As such, the delay control signal DCS may be held at the same value as when the DLL circuitry 14 transitioned away from the calibration mode to maintain the same delay through the alpha digital delay elements 60, 62 and to the beta digital delay elements 64, 66 as when the DLL was calibrated. In one embodiment of the delay control signal DCS, the delay control signal DCS provides a supply voltage to the alpha digital delay elements 60, 62 and to the beta digital delay elements 64, 66, such that the delay through the alpha digital delay elements 60, 62 and to the beta digital delay elements 64, 66 is based on the supply voltage to the alpha digital delay elements 60, 62 and to the beta digital delay elements 64, 66.

In one embodiment of the alpha digital delay elements 60, 62 and the beta digital delay elements 64, 66, the beta digital delay elements 64, 66 are extra delay elements downstream from the alpha digital delay elements 60, 62. The toggling digital delay element 52 receives the mode select signal MODS from the control circuitry 12 (FIG. 2), which selects between a toggling mode and a non-toggling mode according to one embodiment of the control circuitry 12. As previously mentioned, the during the phase measurement mode, the feedback signal FBS is forwarded to the first group 48 of digital delay elements, which includes the toggling digital delay element 52. As such, during the phase measurement mode, the toggling digital delay element 52 receives and forwards the feedback signal FBS. During the phase measurement mode and the toggling mode, the toggling digital delay element 52 toggles between inverting the received and forwarded feedback signal FBS and not inverting the received and forwarded feedback signal FBS at a toggling rate, such that the toggling between inverting the received and forwarded feedback signal FBS and not inverting the received and forwarded feedback signal FBS increases a delay measurement resolution of the DLL circuitry 14. In one embodiment of the toggling digital delay element 52, a period of the toggling rate is about equal to the delay of each of the alpha digital delay elements 60, 62 and the beta digital delay elements 64, 66. The period of the toggling rate may be dithered to further increase the delay measurement resolution of the DLL circuitry 14.

The data capture circuitry 24 includes a second group 68 of data registers and phase encoder circuitry 70. The second group 68 of data registers includes a first data register 72, a first alpha data register 74, and up to and including an $N^{TH}$ alpha data register 76. The second group 68 of data registers further includes a first beta data register 78 and up to and including an $M^{TH}$ beta data register 80. Outputs from the first digital delay element 54, the alpha digital delay elements 60, 62, and the beta digital delay elements 64, 66 are coupled to respective inputs D to the first data register 72, the alpha data registers 74, 76, and the beta data registers 78, 80. Clock inputs CLK to the first data register 72, the alpha data registers 74, 76, and the beta data registers 78, 80 receive the reference clock signal RCS. As such, during the phase measurement mode, at the first transition and the second transition of the reference clock signal RCS, data from the first digital delay element 54, the alpha digital delay elements 60, 62, and the beta digital delay elements 64, 66, which is the output status information OSI, is captured by the first data register 72, the alpha data registers 74, 76, and the beta data registers 78, 80, respectively, and fed to the phase encoder circuitry 70 via the outputs OUT of the first data register 72, the alpha data registers 74, 76, and the beta data registers 78, 80. The phase encoder circuitry 70 provides the first phase difference information FPDI and the second phase difference information SPDI.

Since the digital delay line 22 is calibrated using the reference clock signal RCS, since during the phase measurement mode, the digital delay line 22 receives and forwards the feedback signal FBS, and since the output status information OSI is captured at the first transition and the second transition of the reference clock signal RCS, the output status information OSI is indicative of the phase difference between the reference clock signal RCS and the feedback signal FBS.

The output OUT from the first data register 72 provides a first output signal FOS to the phase encoder circuitry 70. The output OUT from the first alpha data register 74 provides a first alpha output signal FAOS to the phase encoder circuitry 70. The output OUT from the $N^{TH}$ alpha data register 76 provides an $N^{TH}$ alpha output signal NAOS to the phase encoder circuitry 70. The output OUT from the first beta data register 78 provides a first beta output signal FBOS to the phase encoder circuitry 70. The output OUT from the $M^{TH}$ beta data register 80 provides an $M^{TH}$ beta output signal MBOS to the phase encoder circuitry 70.

Figure 5:
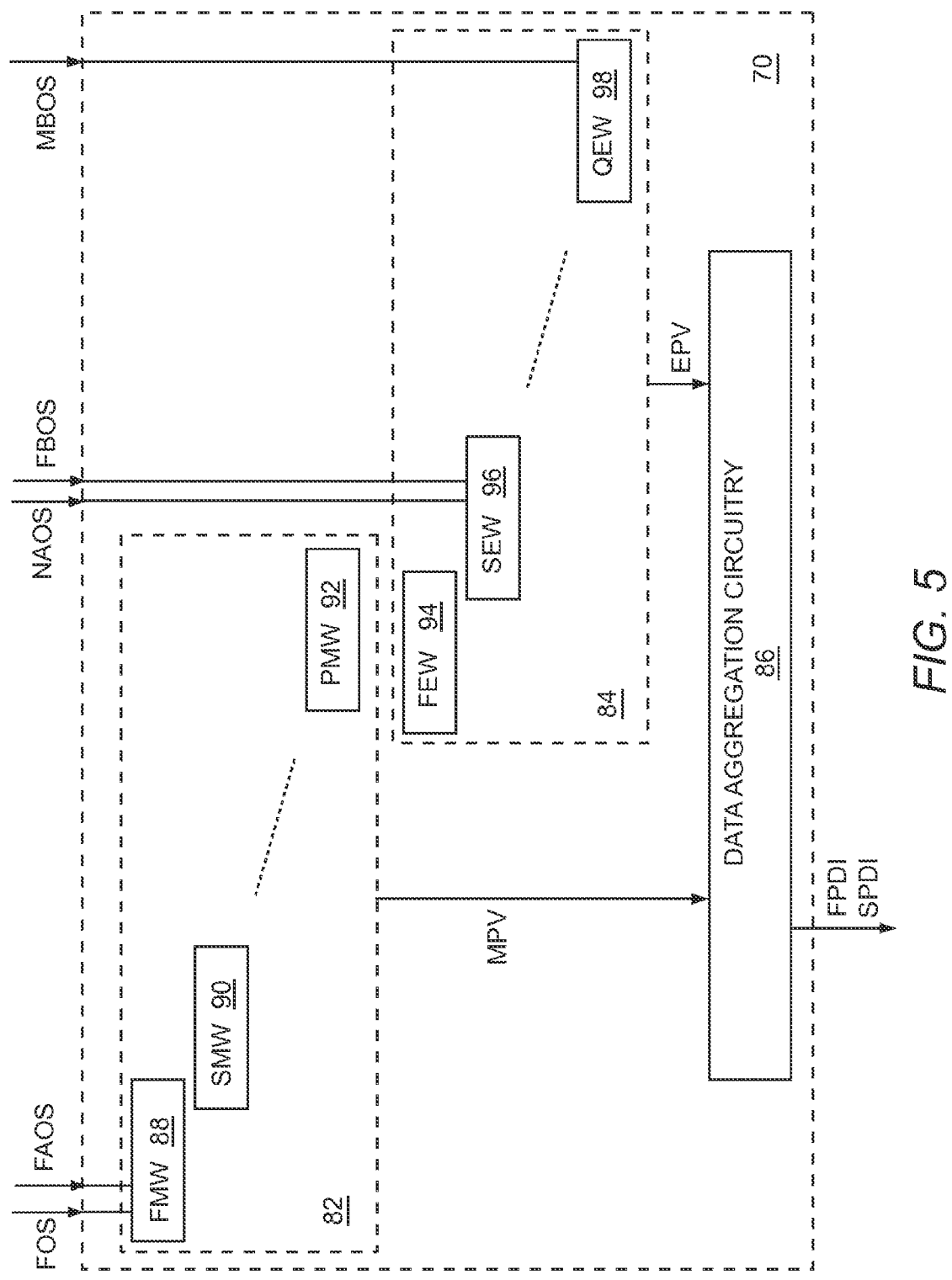
FIG. 5 shows details of phase encoder circuitry illustrated in FIG. 4 according to one embodiment of the phase encoder circuitry.

FIG. 5 shows details of the phase encoder circuitry 70 illustrated in FIG. 4 according to one embodiment of the phase encoder circuitry 70. The phase encoder circuitry 70 includes a main phase encoder 82, an extra phase encoder 84, and data aggregation circuitry 86. The main phase encoder 82 includes a first main window 88, a second main window 90, and up to and including a $P^{TH}$ main window 92. The extra phase encoder 84 includes a first extra window 94, a second extra window 96, and up to and including a $Q^{TH}$ extra window 98. The first main window 88 receives the first output signal FOS and the first alpha output signal FAOS. The second extra window 96 receives the $N^{TH}$ alpha output signal NAOS and the first beta output signal FBOS. The $Q^{TH}$ extra window 98 receives the $M^{TH}$ beta output signal MBOS.

In general, the main phase encoder 82 is coupled to a first portion of the data registers 72, 74, 76, 78, 80 to receive a corresponding first portion of the output signals FOS, FAOS, NAOS, FBOS, MBOS and the extra phase encoder 84 is coupled to a second portion of the data registers 72, 74, 76, 78, 80 to receive a corresponding second portion of the output signals FOS, FAOS, NAOS, FBOS, MBOS. The extra phase encoder 84 may overlap the main phase encoder 82, such that the first portion of the output signals FOS, FAOS, NAOS, FBOS, MBOS and the second portion of the output signals FOS, FAOS, NAOS, FBOS, MBOS include duplicate signals. Further, the main windows 88, 90, 92 each receive a corresponding portion of the output signals FOS, FAOS, NAOS, FBOS, MBOS. The main windows 88, 90, 92 may overlap one another, such that the corresponding portions of the output signals FOS, FAOS, NAOS, FBOS, MBOS include duplicate signals. Additionally, the extra windows 94, 96, 98 each receive a corresponding portion of the output signals FOS, FAOS, NAOS, FBOS, MBOS. The extra windows 94, 96, 98 may overlap one another, such that the corresponding portions of the output signals FOS, FAOS, NAOS, FBOS, MBOS include duplicate signals.

During the phase measurement mode, the main phase encoder 82 captures output status from the first portion of the data registers 72, 74, 76, 78, 80 and may provide part of the first phase difference information FPDI and the second phase difference information SPDI via a main phase value MPV based on the captured status of the first portion of the data registers 72, 74, 76, 78, 80 to the data aggregation circuitry 86. Further, during the phase measurement mode, the extra phase encoder 84 captures output status from the second portion of the data registers 72, 74, 76, 78, 80 and may provide part of the first phase difference information FPDI and the second phase difference information SPDI via an extra phase value EPV based on the captured status of the second portion of the data registers 72, 74, 76, 78, 80 to the data aggregation circuitry 86. The data aggregation circuitry 86 aggregates the partial data from the main phase encoder 82 and the extra phase encoder 84 to provide the first phase difference information FPDI and the second phase difference information SPDI.

The encoders 82, 84 may encode a phase value by determining which of the windows 88, 90, 92, 94, 96, 98 have the first or second transition, and then summing the ones or zeros in the window and adding the weight of the window to create a value that is indicative of the phase difference between the feedback signal FBS and the reference clock signal RCS. The overlap between the windows 88, 90, 92, 94, 96, 98 may help resolve uncertainty when bubbles occur. Normally, the windows 88, 90, 92, 94, 96, 98 will have a large number of contiguous ones or zeros with an occasional transition from a one to a zero or a zero to a one. However, a bubble occurs when there is a transition from a one to a zero soon followed by a transition from the zero back to the one, and vice versa. As such, at window boundaries without overlap, the encoders 82, 84 may have difficulty in accurately determining when a transition occurred. The overlap may help the encoders 82, 84 accurately determine transition times.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) communications circuitry comprising:
control circuitry adapted to select one of a calibration mode, a phase measurement mode, and a normal operation mode; and
delay locked loop (DLL) circuitry adapted to operate in one of the calibration mode and the phase measurement mode and comprising:
a digital delay line comprising a plurality of alpha digital delay elements coupled in series, such that the digital delay line is adapted to:
during the calibration mode, receive and forward a reference clock signal through the plurality of alpha digital delay elements, such that a delay of each of at least some of the plurality of alpha digital delay elements is adjusted to make a phase difference between an output from one of the plurality of alpha digital delay elements and an output from another of the plurality of alpha digital delay elements equal to about zero; and
during the phase measurement mode, receive and forward a feedback signal through the plurality of alpha digital delay elements, such that the feedback signal is representative of an RF output signal from an RF power amplifier; and
data capture circuitry adapted to during the phase measurement mode:
capture output status from each of the at least some of the plurality of alpha digital delay elements in response to a first transition of the reference clock signal, such that the reference clock signal is representative of an RF input signal to the RF power amplifier; and
provide first phase difference information based on the captured output status from the each of the at least some of the plurality of alpha digital delay elements, such that the first phase difference information is indicative of a phase difference between the RF input signal and the RF output signal.

2. The RF communications circuitry of claim 1 wherein:
during the calibration mode, the DLL circuitry operates in a closed loop mode;

during the phase measurement mode, the DLL circuitry operates in an open loop mode;
the captured output status from the each of the plurality of alpha digital delay elements is indicative of a phase difference between the reference clock signal and the feedback signal; and
the RF power amplifier is adapted to amplify the RF input signal to provide the RF output signal.

3. The RF communications circuitry of claim 2 wherein during the normal operation mode and during the phase measurement mode, the RF input signal and the RF output signal are phase modulated.

4. The RF communications circuitry of claim 2 wherein during the normal operation mode, the RF input signal and the RF output signal are phase modulated, and during the phase measurement mode, the RF input signal and the RF output signal are not phase modulated.

5. The RF communications circuitry of claim 2 wherein during the phase measurement mode:
a first signal that is representative of the RF input signal is down-converted to provide the reference clock signal, such that the reference clock signal is an intermediate frequency (IF) signal; and
a second signal that is representative of the RF output signal is down-converted to provide the feedback signal, such that the feedback signal is an IF signal.

6. The RF communications circuitry of claim 5 wherein an RF coupler that is coupled to an output from the RF power amplifier provides the second signal.

7. The RF communications circuitry of claim 5 wherein phase modulation circuitry provides the first signal.

8. The RF communications circuitry of claim 2 wherein:
the data capture circuitry is further adapted to during the phase measurement mode:
capture output status from each of the plurality of alpha digital delay elements in response to a second transition of the reference clock signal; and
provide second phase difference information based on the captured output status from the each of the plurality of alpha digital delay elements, such that the second phase difference information is indicative of a phase difference between the RF input signal and the RF output signal;
the first transition of the reference clock signal occurs when the RF output signal has a first amplitude; and
the second transition of the reference clock signal occurs when the RF output signal has a second amplitude, which is not equal to the first amplitude.

9. The RF communications circuitry of claim 8 wherein the first phase difference information and the second phase difference information are used to determine amplitude modulation-to-phase modulation (AMPM) distortion of the RF power amplifier.

10. The RF communications circuitry of claim 9 wherein during the normal operation mode, the determined AMPM distortion is used to correct for the AMPM distortion of the RF power amplifier.

11. The RF communications circuitry of claim 9 wherein the first transition of the reference clock signal and the second transition of the reference clock signal occur during an amplitude ramp of the RF output signal.

12. The RF communications circuitry of claim 2 wherein the control circuitry is further adapted to select between a toggling mode and a non-toggling mode and the plurality of alpha digital delay elements comprises a toggling digital delay element upstream of the one of the plurality of alpha digital delay elements, such that the toggling digital delay element is adapted to:
during the phase measurement mode and the toggling mode, toggle between inverting and not inverting the received and forwarded feedback signal at a toggling rate; and
during the phase measurement mode and the non-toggling mode, not toggle the received and forwarded feedback signal,
wherein the toggling between inverting and not inverting the received and forwarded feedback signal increases a delay measurement resolution of the DLL circuitry.

13. The RF communications circuitry of claim 12 wherein a period of the toggling rate is about equal to a delay of each of at least some of the plurality of alpha digital delay elements.

14. The RF communications circuitry of claim 12 wherein the toggling rate is dithered to further increase the delay measurement resolution.

15. The RF communications circuitry of claim 2 further comprising the RF power amplifier.

16. The RF communications circuitry of claim 2 wherein a transceiver integrated circuit (IC) provides the RF communications circuitry.

17. RF communications circuitry of claim 2 wherein the DLL circuitry further comprises:
phase comparator circuitry coupled to the output from the one of the plurality of alpha digital delay elements and the output from the another of the plurality of alpha digital delay elements, and adapted to during the calibration mode provide a phase error signal based on the phase difference between the output from the one of the plurality of alpha digital delay elements and the output from the another of the plurality of alpha digital delay elements; and
digital filter circuitry adapted to during the calibration mode receive and filter the phase error signal to provide a delay control signal to the at least some of the plurality of alpha digital delay elements, such that the delay of the each of the at least some of the plurality of alpha digital delay elements is based on the delay control signal.

18. The RF communications circuitry of claim 17 wherein the delay control signal provides a supply voltage to the at least some of the plurality of alpha digital delay elements.

19. The RF communications circuitry of claim 2 wherein:
the another of the plurality of alpha digital delay elements is downstream from the one of the plurality of alpha digital delay elements; and
during the calibration mode, a delay between the output from the one of the plurality of alpha digital delay elements and the output from the another of the plurality of alpha digital delay elements is equal to about one period of the reference clock signal.

20. The RF communications circuitry of claim 19 wherein the digital delay line further comprises a plurality of beta digital delay elements downstream from the another of the plurality of alpha digital delay elements.

21. The RF communications circuitry of claim 20 wherein the plurality of alpha digital delay elements comprises 256 digital delay elements between the output from the one of the plurality of alpha digital delay elements and the output from the another of the plurality of alpha digital delay elements, and the plurality of beta digital delay elements comprises 40 digital delay elements downstream from the output from the another of the plurality of alpha digital delay elements.

22. The RF communications circuitry of claim 2 wherein the data capture circuitry comprises a plurality of data registers, such that each of the plurality of data registers is coupled to an output from a corresponding each of the at least some of the plurality of alpha digital delay elements, such that the each of the plurality of data registers is adapted to during the phase measurement mode, capture the output status from the each of the at least some of the plurality of alpha digital delay elements.

23. The RF communications circuitry of claim 22 wherein the data capture circuitry further comprises:
- a main phase encoder coupled to a first portion of the plurality of data registers, such that the main phase encoder is adapted to during the phase measurement mode, receive the captured output status from the first portion of the plurality of data registers and provide part of the first phase difference information based on the captured output status from the first portion of the plurality of data registers; and
- an extra phase encoder coupled to a second portion of the plurality of data registers, such that the extra phase encoder is adapted to during the phase measurement mode, receive the captured output status from the second portion of the plurality of data registers and provide part of the first phase difference information based on the captured output status from the second portion of the plurality of data registers.

24. The RF communications circuitry of claim 23 wherein the main phase encoder comprises a plurality of windows and the extra phase encoder comprises a plurality of windows.

25. The RF communications circuitry of claim 24 wherein the plurality of windows of the main phase encoder overlap one another, the plurality of windows of the extra phase encoder overlap one another, and the extra phase encoder overlaps the main phase encoder.

26. A method comprising:
- selecting between a calibration mode and a phase measurement mode;
- providing delay locked loop (DLL) circuitry;
- during the calibration mode, receiving and forwarding a reference clock signal through a plurality of alpha digital delay elements;
- during the calibration mode, adjusting a delay of each of at least some of the plurality of alpha digital delay elements to make a phase difference between an output from one of the plurality of alpha digital delay elements and an output from another of the plurality of alpha digital delay elements equal to about zero;
- during the phase measurement mode, receiving and forwarding a feedback signal through the plurality of alpha digital delay elements, such that the feedback signal is representative of an RF output signal from an RF power amplifier;
- during the phase measurement mode, capturing output status from each of the at least some of the plurality of alpha digital delay elements in response to a first transition of the reference clock signal, such that the reference clock signal is representative of an RF input signal to the RF power amplifier; and
- providing first phase difference information based on the captured output status from the each of the at least some of the plurality of alpha digital delay elements, such that the first phase difference information is indicative of a phase difference between the RF input signal and the RF output signal.

* * * * *